(12) United States Patent
Sano et al.

(10) Patent No.: US 10,950,548 B2
(45) Date of Patent: Mar. 16, 2021

(54) SEMICONDUCTOR DEVICE

(71) Applicant: Murata Manufacturing Co., Ltd., Kyoto (JP)

(72) Inventors: Yuichi Sano, Kyoto (JP); Atsushi Kurokawa, Kyoto (JP); Kazuya Kobayashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/903,908

(22) Filed: Feb. 23, 2018

(65) Prior Publication Data
US 2018/0247895 A1    Aug. 30, 2018

(30) Foreign Application Priority Data

Feb. 24, 2017   (JP) .............................. JP2017-034186

(51) Int. Cl.
*H01L 23/532*   (2006.01)
*H01L 23/485*   (2006.01)

(52) U.S. Cl.
CPC ...... *H01L 23/53252* (2013.01); *H01L 23/485* (2013.01)

(58) Field of Classification Search
CPC ..................... H01L 23/53252; H01L 23/485
See application file for complete search history.

(56) References Cited

U.S. PATENT DOCUMENTS

| 4,739,379 A * | 4/1988 | Akagi ................. H01L 29/7371 257/198 |
| 5,821,620 A * | 10/1998 | Hong ................ H01L 21/76838 257/751 |
| 2010/0013098 A1 | 1/2010 | Besling |
| 2011/0186962 A1 | 8/2011 | Moriyama et al. |
| 2013/0001504 A1* | 1/2013 | Ninomiya .......... H01L 45/1233 257/4 |
| 2014/0291838 A1* | 10/2014 | Chen ................... H01L 23/3157 257/737 |

FOREIGN PATENT DOCUMENTS

| CN | 101069280 A | 11/2007 |
| CN | 202285234 U | 6/2012 |
| JP | H09-167856 A | 6/1997 |
| JP | 2008-294403 A | 12/2008 |

* cited by examiner

*Primary Examiner* — Wael M Fahmy
*Assistant Examiner* — Sarah K Salerno
(74) *Attorney, Agent, or Firm* — Pearne & Gordon LLP (57) ABSTRACT

A semiconductor device includes electrodes which contain Au and which are placed above conductive layers in a region adjacent to stacked insulating films and also includes base layers which are composed of compositionally modulated layers and which are placed between the electrodes and the conductive layers. The base layers include lateral end sections composed of single layers projecting from lateral end sections of the electrodes in the direction of the interlayer interface between the insulating films; sections which are located under the electrodes and of which a major compositional component is Ti or Ti and W; and projecting sections which project from under the electrodes in the direction of the interlayer interface between the insulating films and of which compositional components are compositionally modulated to Ti and O, to Ti, O, and N, or to Ti, W, O, and N.

14 Claims, 4 Drawing Sheets

SEMICONDUCTOR DEVICE

This application claims priority from Japanese Patent Application No. JP2017-034186 filed on Feb. 24, 2017. The content of this application is incorporated herein by reference in its entirety.

BACKGROUND OF THE DISCLOSURE

1. Field of the Disclosure

The present disclosure relates to semiconductor devices in which electrodes containing Au are placed above conductive layers in regions adjacent to stacked insulating films. The present disclosure particularly relates to a semiconductor device having a structure inhibiting the migration of a metal component forming electrodes.

2. Description of the Related Art

Hitherto, semiconductor devices inhibiting this type of migration have included a semiconductor device which is disclosed in, for example, Japanese Unexamined Patent Application Publication No. 2008-294403 (hereinafter referred to as Patent Document 1) and which has a structure inhibiting the migration of a metal component, Cu, forming interconnect electrodes. The semiconductor device includes a first interconnect layer placed on a surface of a semiconductor substrate. The first interconnect layer includes an interlayer insulating film, a side-surface barrier metal layer, a Cu interconnect, and an upper-surface barrier metal layer. An upper portion of the Cu interconnect is covered by the upper-surface barrier metal layer. The upper-surface barrier metal layer is similar to the side-surface barrier metal layer and is made of a material such as Ti, TiN, or TiW. The upper-surface barrier metal layer has a width greater than the width of the upper portion of the Cu interconnect. The upper-surface barrier metal layer inhibits the diffusion of Cu from the Cu interconnect into the interlayer insulating film, which is located above the Cu interconnect.

Japanese Unexamined Patent Application Publication No. 9-167856 (hereinafter referred to as Patent Document 2) discloses a light-emitting diode including an anode electrode having a structure different from a known one. The anode electrode is formed by stacking an AuGeNi layer serving as an ohmic contact layer, an Au layer for providing good connectivity, a TiNO layer serving as a diffusion barrier layer, a Ti layer having a diffusion barrier effect and a connection-facilitating effect, and an Au layer serving as a connecting metal layer for facilitating wire bonding on an AlGaAs contact layer in that order. The TiNO layer, which serves as a diffusion barrier layer, reduces the deposition of a metal component, Al, in the AlGaAs contact layer on a surface of the anode electrode by migration such that Al oxides are unlikely to be formed on the anode electrode surface.

However, the semiconductor device disclosed in Patent Document 1 inhibits the diffusion of an electrode material such as Cu into the interlayer insulating film using the upper-surface barrier metal layer and is not intended for an electrode material such as Au. The upper-surface barrier metal layer has a composition containing Ti, TiW, or the like. Cu, which forms interconnect electrodes, reacts with these metal components to form metal compounds in some cases. Forming the metal components increases the electrical resistance between upper and lower interconnect electrodes. This is not preferable.

The semiconductor device disclosed in Patent Document 2 inhibits the diffusion of a metal component such as Al using the TiNO layer and is not intended for an electrode material such as Au similarly to the semiconductor device disclosed in Patent Document 2. The semiconductor device disclosed in Patent Document 2 simply inhibits the diffusion of the metal component into a surface of an upper electrode and does not inhibit the diffusion of the metal component into an insulating film present in a region adjacent to the electrode. The TiNO layer is used as a diffusion barrier layer for Al. Since the TiNO layer forms an insulating film, it is conceivable that, in the case of inserting the TiNO layer into an electrode layer, a bias electrode is not effectively applied to an element.

BRIEF SUMMARY OF THE DISCLOSURE

It is an object of the present disclosure to provide a semiconductor device which suppresses the occurrence of such a migration that an electrode component such as Au diffuses into the interlayer interface between insulating films present in a region adjacent to an electrode, which has a structure capable of ensuring the electrical contact between the electrode and a conductive layer under the electrode well, and which has an increased yield.

According to preferred embodiments of the present disclosure, a semiconductor device includes electrodes containing Au and placed above conductive layers in a region adjacent to stacked insulating films, wherein each of the electrodes includes a lower base layer and an upper electrode portion, wherein each of the base layers includes lateral end sections projecting from lateral end sections of each of the electrodes in a direction of an interlayer interface between the insulating films, wherein a major component of the base layers is Ti or W, and wherein a composition of projecting sections of the base layers projecting in the direction of the interlayer interface between the insulating films is modified to include O or N in addition to Ti or W.

According to this configuration, in the base layers placed between the electrodes and the conductive layers, the major compositional component of the sections located under the electrodes is Ti or W and the composition of the projecting sections projecting in the direction of the interlayer interface between the insulating films is modified to include O or N. In the base layers, since the projecting sections projecting in the direction of the interlayer interface between the insulating films are compositionally modulated as described above, the projecting sections are in contact with the insulating films therearound with good adhesion. Therefore, gaps are not present between the projecting sections of the base layers and the insulating films and there is no room to allow the moisture to enter. Thus, even if moisture penetrates the interlayer interface between the insulating films, which are apart from the electrodes, OH groups of the moisture cannot migrate in contact portions between the projecting sections of the base layers and the insulating films or do not reach the electrodes, which contain Au. In the case where the OH groups reach the projecting sections of the base layers, the OH groups react with Ti or TiW or W in the projecting sections to oxidize the projecting sections; hence, moisture cannot reach the electrodes. Therefore, the OH groups, which cause the migration of an electrode metal, are isolated from the electrodes, thereby suppressing the occurrence of such a migration that Au, which is a metal component contained in the electrodes, diffuses into the interlayer interface between the insulating films.

Since the major compositional component of the sections of the base layers that are located under the electrodes is Ti or W, the electrical resistance of the sections of the base layers that are located under the electrodes is kept low. Therefore, the interconnection resistance between the electrodes and the conductive layers, which sandwich the base layers, does not increase.

$TiO_2$, TiON, or TiWON, which forms the projecting sections of the base layers, exhibits a photocatalytic effect when being irradiated with light. Thus, the residue remaining at the interlayer interface between the insulating films without being removed by a cleaning process in the fabrication of the semiconductor device is removed by the photocatalytic effect. Therefore, the delamination is inhibited from occurring at the interlayer interface between the insulating films.

As a result, the semiconductor device can be provided in an increased yield such that the semiconductor device can suppress the occurrence of such a migration that an electrode component such as Au diffuses into the interlayer interface between the insulating films in a region adjacent to the electrodes to cause migration; can ensure the electrical contact between the electrodes and the conductive layers, which are located thereunder, well; and has a structure capable of inhibiting the delamination from occurring at the interlayer interface between the insulating films.

In the semiconductor device, the insulating films mainly contain silicon nitride.

Silicon nitride, which forms the insulating films, is in contact with the compositional components forming the projecting sections of the base layers with particularly good adhesion. Therefore, according to this configuration, the above effect of the present disclosure is remarkably exhibited.

In the semiconductor device, the lateral end sections of the base layers that project in the direction of the interlayer interface between the insulating films are chamfered to form slopes.

According to this configuration, since the lateral end sections of the base layers are chamfered, dielectric breakdown due to the concentration of an electric field on a sharp corner can be inhibited from occurring in the insulating films. Since the slopes are formed by chamfering, the contact area between the base layers and the insulating films on the interlayer interface adjacent to the base layers is large. Thus, the contact regions between the insulating films and the base layers, the contact regions having good adhesion, are formed over a long distance from an interlayer between the insulating films to the electrodes. Therefore, a longer distance with no space accepting OH groups can be ensured from the interlayer between the insulating films to the electrodes and the occurrence of migration can be more reliably suppressed. Since the slopes are formed by chamfering, the projecting sections of the base layers that are in contact with the insulating films are exposed to the side sections of the electrodes and have an increased area. Therefore, a photocatalytic substance contained in the projecting sections of the base layers exhibits a significant photocatalytic effect, whereby the residue is effectively removed. As a result, the semiconductor device can be provided in a further increased yield.

In the semiconductor device, the length of the lateral end sections of the base layers that project from the lateral end sections of the electrodes in the direction of the interlayer interface between the insulating films is set to about 30 nm or more.

According to this configuration, an effect induced by the fact that the projecting sections of the base layers are in contact with the insulating films therearound with good adhesion is reliably exhibited.

In the semiconductor device, the electrodes have side and upper surfaces covered by covering layers made of the same material as that of the projecting sections of the base layers.

According to this configuration, since the side and upper surfaces of the electrodes are in contact with the insulating films therearound and the residue remaining on the side and upper surfaces of the electrodes is removed by a photocatalytic effect of the covering layers, the above effects are exhibited on the side and upper surfaces of the electrodes. Therefore, the semiconductor device can be provided in a further increased yield.

In the semiconductor device, the electrodes are interconnect electrodes which are substantially arc- or polygon-shaped in a plan view or which have a shape bent at substantially an obtuse angle in a plan view and the base layers extend under the electrodes along the interconnection direction of the electrodes.

Residue incapable of being removed by a cleaning process in the fabrication of the semiconductor device is likely to remain at bent sections of the interconnect electrodes that are bent at a right angle in a plan view. However, according to this configuration, since the interconnect electrodes include the bent sections, which are substantially arc-shaped or have a shape bent at substantially an obtuse angle in a plan view, the residue is unlikely to remain at the bent sections of the interconnect electrodes. Furthermore, since the base layers extend under the interconnect electrodes along the interconnection direction of the interconnect electrodes, the residue remaining around the interconnect electrodes is removed by the above photocatalytic effect. Therefore, the delamination of the insulating films is unlikely to occur even at the bent sections of the interconnect electrodes and appearance defects due to the delamination are unlikely to occur.

According to preferred embodiments of the present disclosure, the following device can be provided: a semiconductor device which can suppress the occurrence of such a migration that an electrode component such as Au diffuses into the interlayer interface between insulating films present in a region adjacent to an electrode, which has a structure capable of ensuring the electrical contact between the electrode and a conductive layer under the electrode well and capable of inhibiting the delamination from occurring at the interlayer interface between the insulating films, and which has an increased yield.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Embodiments of the present disclosure are described below.

Figure 1:
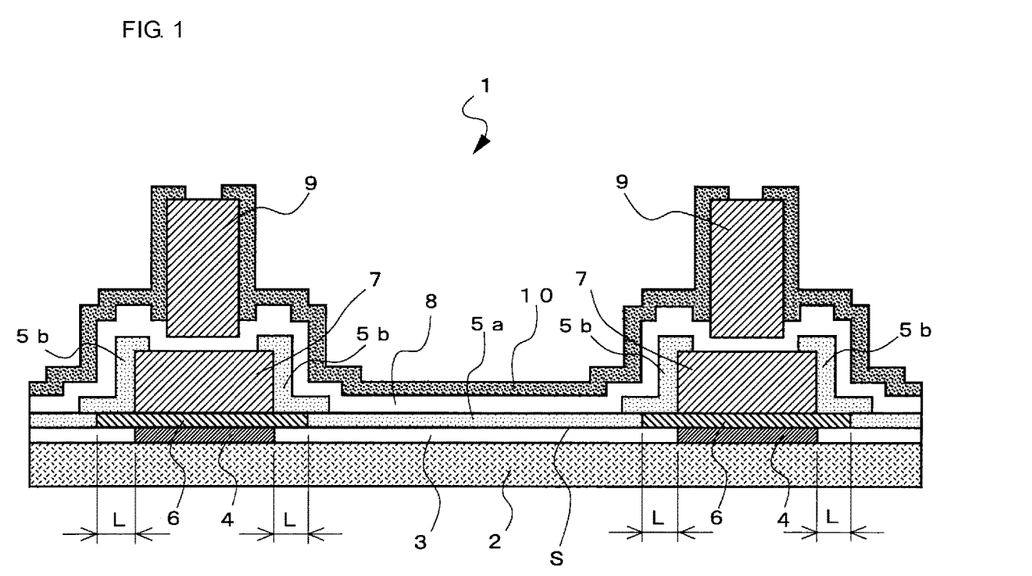
FIG. 1 is a sectional view of a semiconductor device according to a first embodiment of the present disclosure.

FIG. 1 is a sectional view of a semiconductor device 1 according to a first embodiment of the present disclosure.

The semiconductor device 1 is placed on a GaAs semiconductor substrate 2. A surface of the GaAs semiconductor substrate 2 is overlaid with conductive layers 4 formed by selectively removing a first via layer 3. The first via layer 3 forms an insulating film made of silicon nitride ($Si_3N_4$). Via grooves are formed in the first via layer 3 and are filled with a conductive material so as to connect an upper interconnect to a lower interconnect, whereby vias are formed. The conductive layers 4 are composed of metal electrodes. In the case of forming, for example, a heterojunction bipolar transistor (HBT), the conductive layers 4 are made of Au and serve as collector electrodes.

The first via layer 3 is overlaid with an insulating layer 5a, made of silicon nitride. The conductive layers 4 are overlaid with base layers 6 formed by selectively removing the insulating layer 5a and are in contact with the base layers 6. The base layers 6 are overlaid with first interconnect electrodes 7 made of Au. Then, each of the electrodes includes a lower base layer 6 and an upper electrode 7 portion.

The base layers 6 include lateral end sections composed of single layers projecting from lateral end sections of the first interconnect electrodes 7 in the direction of the interlayer interface between the first via layer 3 and the insulating layer 5a. The base layers 6 are composed of compositionally modulated layers. A major compositional component of the sections of the base layers 6 that are located under the first interconnect electrodes 7 is Ti or Ti and W. Compositional components of the projecting sections of the base layers 6 that project from under the first interconnect electrodes 7 in the direction of the interlayer interface between the first via layer 3 and the insulating layer 5a are compositionally modulated to Ti and O, to Ti, O, and N, or to Ti, W, O, and N. Thus, the composition of the sections of the base layers 6 that are located under the first interconnect electrodes 7 is represented by $Ti_xW_y$, where x+y=1. The composition of the projecting sections of the base layers 6 is represented by $Ti_xW_yO_zN_{1-x-y-z}$, where x+y+z=1.

A process for preparing the base layers 6 is preferably vapor deposition or sputtering. For vapor deposition, the projecting sections of the base layers 6 can be readily formed in a short time in such a manner that a mask having openings with a width suitable for forming the first interconnect electrodes 7 is used and the incident angle of the deposition is set to be diagonal. In this manner, the length L of the projecting sections of the base layers 6 is preferably set to about 30 nm or more. The upper limit of the length L of the projecting sections of the base layers 6 is not particularly limited, but may be appropriately set depending on the distance between neighboring elements, and is set to, for example, about 1,000 nm. The first interconnect electrodes 7 can be subsequently formed by vapor deposition in such a manner that the incident angle of the deposition is set to be perpendicular after the projecting sections of the base layers 6 are formed. Since the projecting sections of the base layers 6 are exposed to the side sections of the first interconnect electrodes 7 after the first interconnect electrodes 7 are formed on the base layers 6, the projecting sections of the base layers 6 can be readily compositionally modulated by oxidation in such a manner that, for example, aqueous hydrogen peroxide is applied to the semiconductor device 1.

In the semiconductor device 1, the first interconnect electrodes 7, which are made of Au, are placed above the conductive layers 4 in a region adjacent to the stacked first via layer 3 and the insulating layer 5a and the base layers 6 are placed between the first interconnect electrodes 7 and the conductive layers 4 as described above. The insulating layers 5b made of substantially the same material as that of the insulating layer 5a extend continuously from the insulating layer 5a over the regions partly covering the upper portions of the projecting sections of the base layers 6 and the upper and side surfaces of the first interconnect electrodes 7. The insulating layers 5a and 5b and the upper surfaces of the first interconnect electrodes 7 that are exposed to the insulating layers 5b are overlaid with a second via layer 8, made of silicon nitride, similar to the first via layer 3. Furthermore, the first interconnect electrodes 7 are overlaid with second interconnect electrodes 9 made of Au with the second via layer 8 therebetween. The second via layer 8 and the second interconnect electrodes 9 are covered by a protective film 10 made of silicon nitride.

According to the semiconductor device 1, in the base layers 6, which are placed between the first interconnect electrodes 7 and the conductive layers 4, the major compositional component of the sections located under the first interconnect electrodes 7 is Ti or Ti and W and the compositional components of the projecting sections projecting in the direction of the interlayer interface between the first via layer 3 and the insulating layer 5a are compositionally modulated to Ti and O, to Ti, O, and N, or to Ti, W, O, and N. In the base layers 6, since the projecting sections projecting in the direction of the interlayer interface between the first via layer 3 and the insulating layer 5a are compositionally modulated as described above, the projecting sections are in contact with the first via layer 3 and the insulating layers 5a and 5b with good adhesion. Therefore, gaps are not present between the projecting sections of the base layers 6, the first via layer 3, and the insulating layers 5a and 5b and there is no room to allow the moisture to enter. Thus, even if moisture penetrates the interlayer interface between the first via layer 3 and the insulating layer 5a, which are apart from the first interconnect electrodes 7, OH groups of the moisture cannot migrate in the contact portions between the projecting sections of the base layers 6, the first via layer 3, and the insulating layers 5a and 5b or do not reach the first interconnect electrodes 7, which contain Au. In the case where the OH groups reach the projecting sections of the base layers 6, the OH groups react with Ti or TiW in the projecting sections to oxidize the projecting sections; hence, the moisture cannot reach the first interconnect electrodes 7. Therefore, the OH groups, which cause the migration of an electrode metal, are isolated from the first interconnect electrodes 7, thereby suppressing the occurrence of such a migration that Au, which is a metal component contained in the first interconnect electrodes 7, diffuses into the interlayer interface S between the first via layer 3 and the insulating layer 5a.

Since the major compositional component of the sections of the base layers 6 that are located under the first interconnect electrodes 7 is Ti or Ti and W, the electrical resistance of the sections of the base layers 6 that are located under the first interconnect electrodes 7 is kept low. Therefore, the interconnection resistance between the first interconnect electrodes 7 and the conductive layers 4, which sandwich the base layers 6, does not increase. In order to keep the electrical resistance of the sections of the base layers 6 that are located under the first interconnect electrodes 7 low, the compositional modulation from $Ti_xW_y$ in the sections of the base layers 6 that are located under the first interconnect electrodes 7 to $Ti_xW_yO_zN_{1-x-y-z}$ in the projecting sections of the base layers 6 is preferably sharp. The sections of the base layers 6 that are located under the first interconnect electrodes 7 may contain a slight amount of O or N, if there is no practical problem with the electrical resistance of the base layers 6.

$TiO_2$, TiON, or TiWON, which forms the projecting sections of the base layers 6, exhibits a photocatalytic effect when being irradiated with light. Thus, the residue remaining at the interlayer interface S between the first via layer 3 and the insulating layer 5a without being removed by a cleaning process in the fabrication of the semiconductor device 1 is removed by the photocatalytic effect. Therefore, the delamination is inhibited from occurring at the interlayer interface S between the first via layer 3 and the insulating layer 5a.

As a result, the semiconductor device 1 can be provided in an increased yield such that the semiconductor device 1 can suppress the occurrence of such a migration that an electrode component such as Au diffuses into the interlayer interface S between the first via layer 3 and the insulating layer 5a in a region adjacent to the first interconnect electrodes 7; can ensure the electrical contact between the first interconnect electrodes 7 and the conductive layers 4, which are located thereunder, well; and has a structure capable of inhibiting the delamination from occurring at the interlayer interface S between the first via layer 3 and the insulating layer 5a.

In the semiconductor device 1, insulating films such as the first via layer 3 and the insulating layers 5a and 5b are made of silicon nitride, that is, the insulating films mainly contain silicon nitride. Silicon nitride, which forms the insulating films, is in contact with the compositional components forming the projecting sections of the base layers 6 with particularly good adhesion. Therefore, according to the semiconductor device 1, the above effect is remarkably exhibited.

In the semiconductor device 1, the length L of the lateral end sections of the base layers 6 that project from the lateral end sections of the first interconnect electrodes 7 in the direction of the interlayer interface between the first via layer 3 and the insulating layer 5a is set to about 30 nm or more. Therefore, an effect induced by the fact that the projecting sections of the base layers 6 are in contact with the insulating films therearound with good adhesion is reliably exhibited.

Some variations of the embodiments are available. For example, the base layers are single layer of Ti or W or TiW. Some variations of the base layers are multi-layers, TiW/Ti or W/Ti. The modifications to include O or N in addition to Ti or W may be gradual or steep. The example of steep modification is that the only surface of the base layer is oxidizing or nitriding. It is not necessary that the all projecting section of the base layers is modified to include O or N. The modifications in some area of projecting sections of the base layers can protect against moisture damage.

Figure 2:
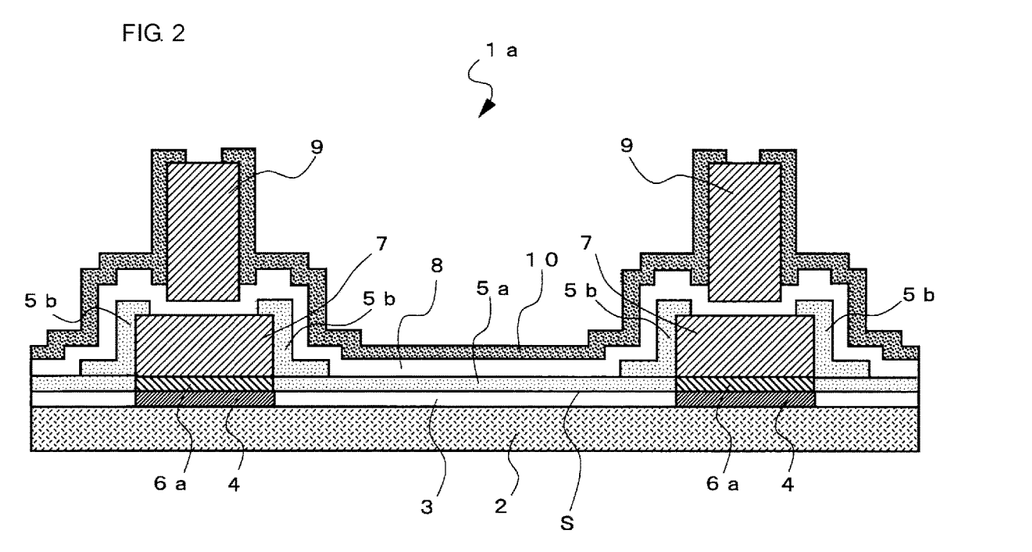
FIG. 2 is a sectional view of a semiconductor device compared to the semiconductor device according to the first embodiment.

A semiconductor device 1a shown in FIG. 2 differs from the semiconductor device 1 according to the first embodiment in that base layers 6a placed between first interconnect electrodes 7 and conductive layers 4 are located only under these first interconnect electrodes 7. In FIG. 2, the members identical or corresponding to those shown in FIG. 1 are given the same reference numerals and will not be described in detail. This semiconductor device 1a does not include any projecting sections projecting from under these first interconnect electrodes 7 in the direction of the interlayer interface between a first via layer 3 and an insulating layer 5a as described in the first embodiment.

In this semiconductor device 1a, which has such a configuration, if moisture penetrates the interlayer interface S between this first via layer 3 and this insulating layer 5a between these first interconnect electrodes 7, then OH groups reach side surfaces of these base layers 6a along the interlayer interface S therebetween because of the bias applied to an element attached to this semiconductor device 1a and also reach side surfaces of these first interconnect electrodes 7 that are flush with the side surfaces of these base layers 6a. Thus, the OH groups react with Au in these first interconnect electrodes 7 to cause migration and Au diffuses into the interlayer interface S between this first via layer 3 and this insulating layer 5a. As a result, a short circuit occurs between these neighboring first interconnect electrodes 7, that is, neighboring elements such as HBTs or capacitors.

If the residue, including $Na^+$, $Cl^-$, C, and $NH_4^+$, incapable of being removed by a process for cleaning this semiconductor device 1a remains at the interlayer interface S between this first via layer 3 and this insulating layer 5a or the OH groups penetrate the interlayer interface S therebetween, then the delamination occurs at the interlayer interface S between this first via layer 3 and this insulating layer 5a.

However, in the semiconductor device 1 according to the first embodiment, the projecting sections of the base layers 6 project in the direction of the interlayer interface between the first via layer 3 and the insulating layer 5a and are in contact with the first via layer 3 and insulating layers 5a and 5b therearound with good adhesion as described above. Therefore, gaps are not present between the projecting sections of the base layers 6, the first via layer 3, and the insulating layers 5a and 5b and there is no room to allow the moisture to enter; hence, unlike this semiconductor device 1a, a failure such as a short circuit does not occur. The residue incapable of being removed by a cleaning process is removed by the photocatalytic effect exhibited by the projecting sections of the base layers 6 and therefore the delamination is inhibited from occurring at the interlayer interface S between the first via layer 3 and the insulating layer 5a.

Figure 3:
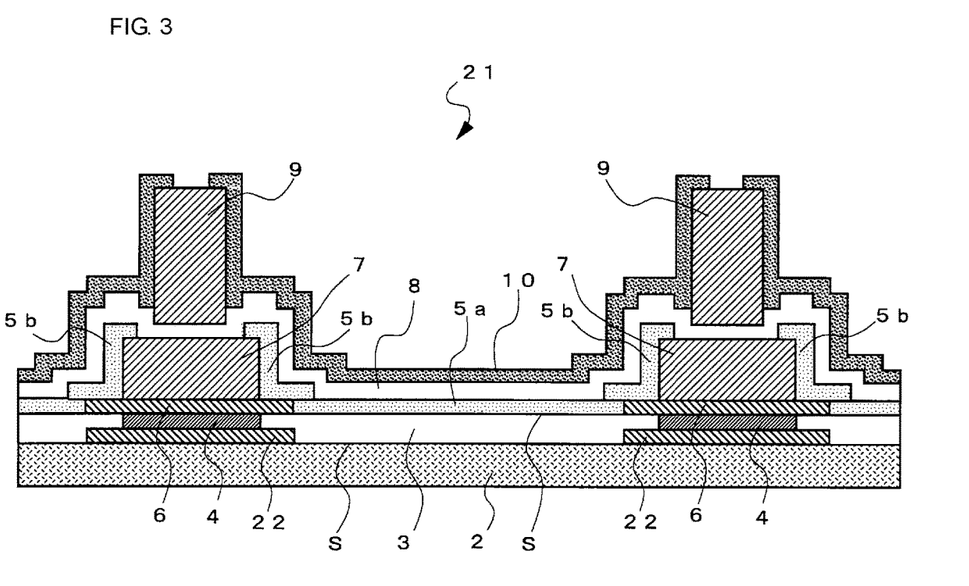
FIG. 3 is a sectional view of a semiconductor device according to a second embodiment of the present disclosure.

FIG. 3 is a sectional view of a semiconductor device 21 according to a second embodiment of the present disclosure. In FIG. 3, the members identical or corresponding to those shown in FIG. 1 are given the same reference numerals and will not be described in detail.

The semiconductor device 21 differs from the semiconductor device 1 according to the first embodiment in that the semiconductor device 21 includes base layers 22, similar to base layers 6, located between conductive layers 4 and a GaAs semiconductor substrate 2. For the rest, the semiconductor device 21 has substantially the same configuration as that of the semiconductor device 1 according to the first embodiment.

The semiconductor device 21 according to the second embodiment exhibits substantially the same action effect as that of the semiconductor device 1 according to the first embodiment. In addition, the projecting sections of the base layers 22 that project from under the conductive layers 4 have a composition represented by $Ti_xW_yO_zN_{1-x-y-z}$ and therefore a photocatalytic effect thereof inhibits the delamination from occurring at the interlayer interface S between a first via layer 3 and the GaAs semiconductor substrate 2.

Figure 4:
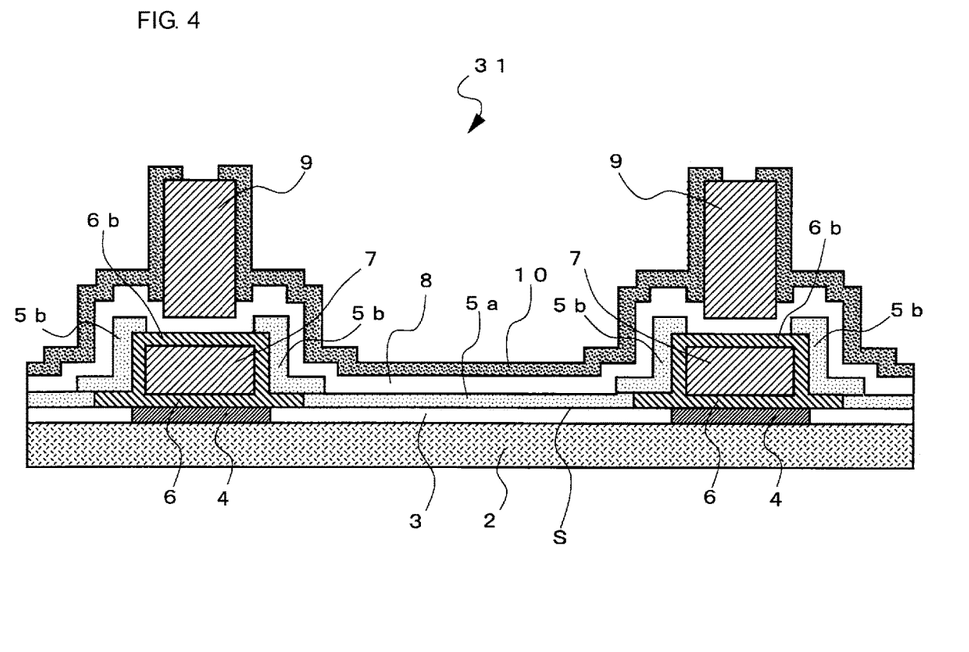
FIG. 4 is a sectional view of a semiconductor device according to a third embodiment of the present disclosure.

FIG. 4 is a sectional view of a semiconductor device 31 according to a third embodiment of the present disclosure. In FIG. 4, the members identical or corresponding to those shown in FIG. 1 are given the same reference numerals and will not be described in detail.

The semiconductor device 31 differs from the semiconductor device 1 according to the first embodiment in that first interconnect electrodes 7 have side and upper surfaces covered by covering layers 6b made of the same material as that of the projecting sections of base layers 6. For the rest, the semiconductor device 31 has substantially the same configuration as that of the semiconductor device 1 according to the first embodiment.

The semiconductor device 31 according to the third embodiment exhibits substantially the same action effect as that of the semiconductor device 1 according to the first embodiment. In addition, the side and upper surfaces of the first interconnect electrodes 7 are in contact with a insulating layer 5b with good adhesion, the insulating layer 5b being an insulating film therearound, and the residue remaining on the side and upper surfaces of the first interconnect electrodes 7 is removed by a photocatalytic effect of the covering layers 6b; hence, the above effects are exhibited on the side and upper surfaces of the first interconnect electrodes 7. Therefore, the semiconductor device 31 can be provided in a further increased yield.

Figure 5:
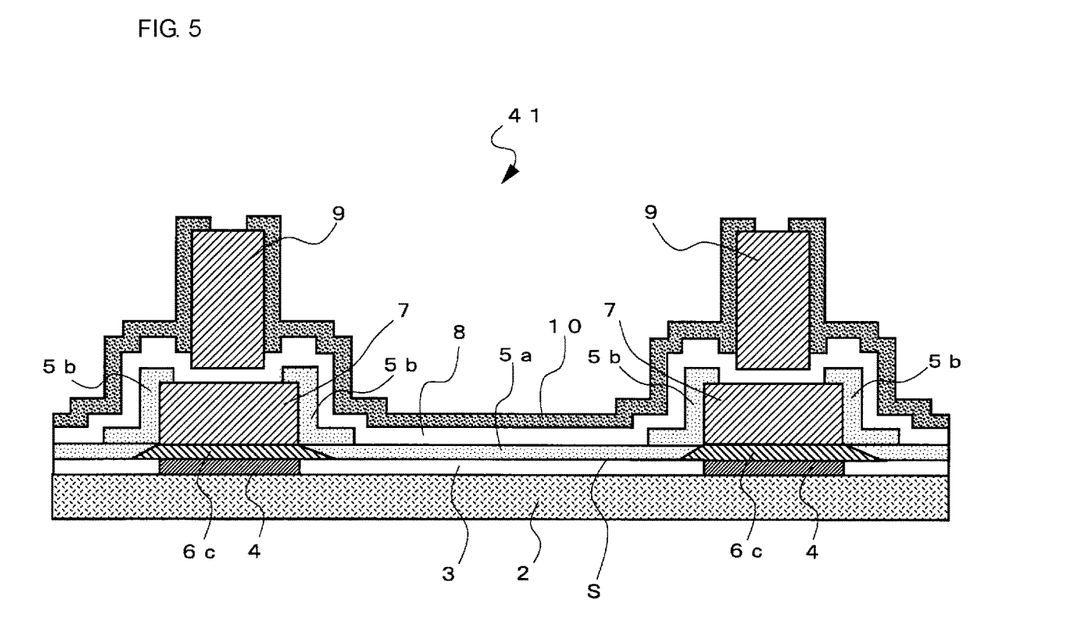
FIG. 5 is a sectional view of a semiconductor device according to a fourth embodiment of the present disclosure.

FIG. 5 is a sectional view of a semiconductor device 41 according to a fourth embodiment of the present disclosure. In FIG. 5, the members identical or corresponding to those shown in FIG. 1 are given the same reference numerals and will not be described in detail.

The semiconductor device 41 differs from the semiconductor device 1 according to the first embodiment in that base layers 6c include lateral end sections which project in the direction of the interlayer interface between a first via layer 3 and a insulating layer 5a and which are chamfered to form slopes. For the rest, the semiconductor device 41 has substantially the same configuration as that of the semiconductor device 1 according to the first embodiment.

In accordance with the semiconductor device 41 according to the first embodiment, since the lateral end sections of the base layers 6c are chamfered, dielectric breakdown due to the concentration of an electric field on a sharp corner can be inhibited from occurring in the first via layer 3, the insulating layer 5a, and insulating layers 5b which are insulating films therearound. Since the slopes are formed by chamfering, the contact area between the insulating layer 5a and each base layer 6c on an interlayer interface S adjacent to the base layer 6c is large. Thus, a contact region between the insulating layer 5a and the base layer 6c, the contact region having good adhesion, extends over a long distance from an interlayer between the first via layer 3 and the insulating layer 5a to first interconnect electrodes 7. Therefore, a longer distance with no space accepting OH groups can be ensured from the interlayer between the first via layer 3 and the insulating layer 5a to the first interconnect electrodes 7 and the occurrence of migration can be more reliably suppressed. Since the slopes are formed by chamfering, the projecting sections of the base layers 6c that are in contact with the insulating layer 5a are exposed to the side sections of the first interconnect electrodes 7 and have an increased area. Therefore, a photocatalytic substance contained in the projecting sections of the base layers 6c exhibits a significant photocatalytic effect, whereby the residue is effectively removed. As a result, the semiconductor device 41 can be provided in a further increased yield.

Figure 6:
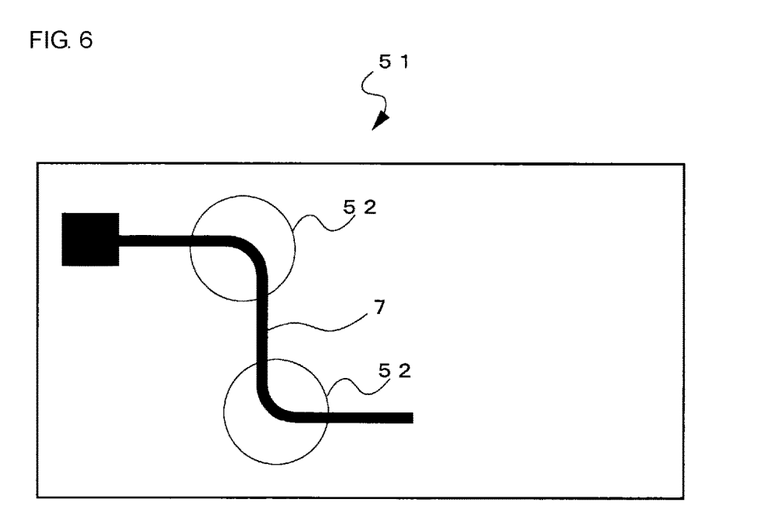
FIG. 6 is a plan view of a semiconductor device according to a fifth embodiment of the present disclosure.

FIG. 6 is a plan view of a semiconductor device 51 according to a fifth embodiment of the present disclosure. In FIG. 6, only one of first interconnect electrodes 7 similar to those described in each of the first to fourth embodiments is shown and other members are not shown.

Each first interconnect electrode 7 is placed on or above a surface of a substrate of the semiconductor device 51 and includes bent sections which are each surrounded by a circle 52 and which are substantially arc-shaped in a plan view. A base layer 6 or 6c, which is not shown, similar to one described in each of the first to fourth embodiments extends under the first interconnect electrode 7 along the interconnection direction of the first interconnect electrode 7.

Figure 7:
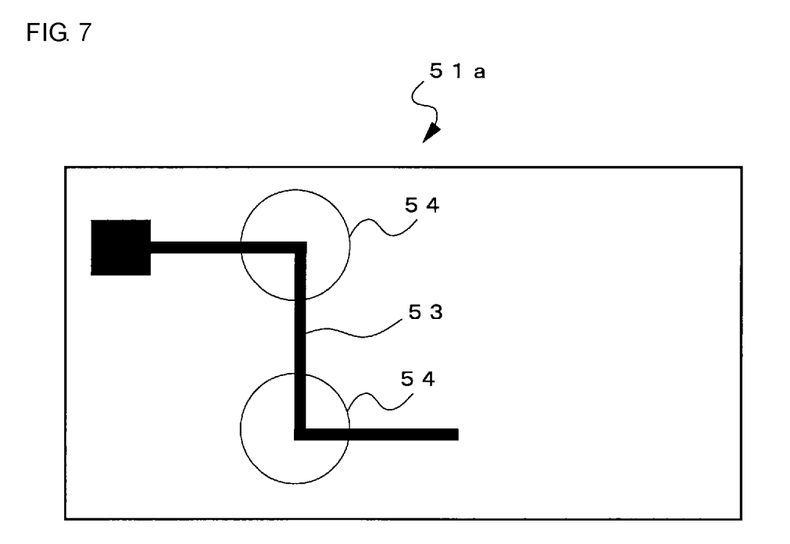
FIG. 7 is a plan view of a semiconductor device compared to the semiconductor device according to the fifth embodiment.

FIG. 7 is a plan view of a semiconductor device 51a. In the semiconductor device 51a, the bent sections of an interconnect electrode 53 that are each surrounded by a circle 52 have a shape bent at substantially a right angle in a plan view. The residue incapable of being removed by a cleaning process in the fabrication of the semiconductor device 51a is likely to remain at the bent sections of the interconnect electrode 53 that are bent at a right angle in a plan view. However, in accordance with the semiconductor device 51 according to the fifth embodiment, since the first interconnect electrodes 7 include the bent sections, which are substantially arc-shaped in a plan view as shown in FIG. 6, the residue is unlikely to remain at the bent sections of the first interconnect electrodes 7. Furthermore, since the base layers 6 or the base layers 6c extend under the first interconnect electrodes 7 along the interconnection direction of the first interconnect electrodes 7, the residue remaining around the first interconnect electrodes 7 is removed by the above photocatalytic effect. Therefore, the delamination of an insulating film is unlikely to occur even at the bent sections of the first interconnect electrodes 7 and appearance defects due to the delamination are unlikely to occur.

Figure 8A:
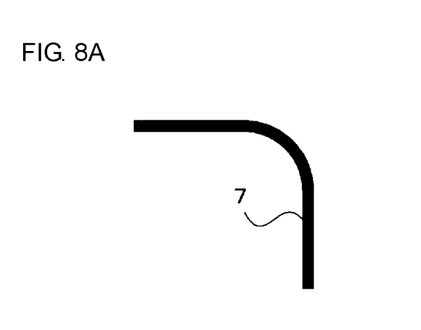
FIGS. 8A to 8D are plan views of modifications of a bent portion of a first interconnect electrode in the semiconductor device according to the fifth embodiment.
Figure 8B:
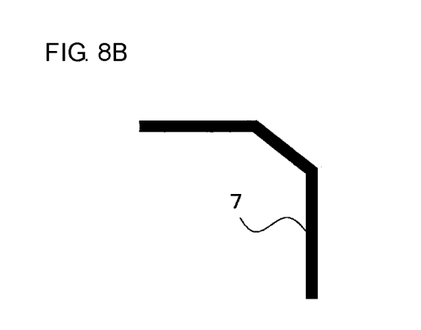
Figure 8C:
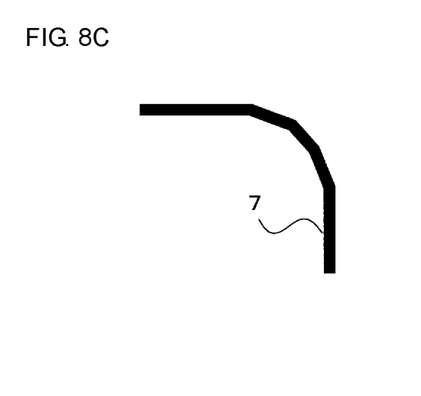
Figure 8D:
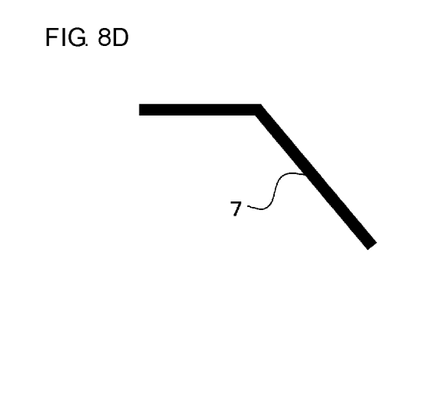

In the above description, the bent sections of the first interconnect electrodes 7 are substantially arc-shaped in a plan view as shown in FIG. 8A. However, the bent sections of the first interconnect electrodes 7 may be substantially polygon-shaped in a plan view as shown in FIG. 8B or 8C or may have a shape bent at substantially an obtuse angle in a plan view as shown in FIG. 8D. Even in such a case, substantially the same action effect as that of the semiconductor device 51 according to the fifth embodiment is exhibited.

The semiconductor devices 1, 21, 31, 41, and 51 according to the above embodiments are preferably used in electrode structures containing Au in the case of forming HBTs or capacitors as elements, whereby the migration of Au is suppressed and the moisture resistance of apparatuses is increased.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a semiconductor substrate;
a conductive layer on the semiconductor substrate;
a conductive lower base layer on the conductive layer;
a first electrode containing Au on the conductive lower base layer;
insulating films stacked adjacent to the conductive lower base layer;
a via layer comprising silicon nitride, the via layer covering a part of the insulating films and a part of a top surface of the electrode;
a second electrode containing Au on the via layer; and
a protective film covering the via layer, a side surface of the second electrode, and a part of a top surface of the second electrode,
wherein the conductive lower base layer is in direct contact with the conductive layer,
the conductive lower base layer includes lateral end sections projecting from outermost lateral ends of the electrode in a lateral direction when viewed in a direction perpendicular to a main surface of the semiconductor substrate, a length of each of the lateral end sections of the conductive lower base layer projecting from the outermost lateral ends of the electrode in the lateral direction between the insulating films is 30 nm or more and 1,000 nm or less,
each of the lateral end sections of the conductive lower base layer is placed between the insulating films,
a major component of the conductive lower base layer is Ti or W,
a composition of the lateral end sections of the conductive lower base layer includes O or N in addition to Ti or W, and
a smallest distance from a top surface of the first electrode to a bottom surface of the second electrode in the direction perpendicular to the main surface of the semiconductor substrate is smaller than a smallest distance from the top surface of the first electrode to a bottom surface of the protective film in the direction perpendicular to the main surface of the semiconductor substrate.

2. The semiconductor device according to claim 1, wherein the insulating films mainly contain silicon nitride.

3. The semiconductor device according to claim 2, wherein the lateral end sections of the base layers projecting in the direction of the interlayer interface between the insulating films are chamfered to form slopes.

4. The semiconductor device according to claim 2, wherein the electrodes have side and upper surfaces covered by covering layers made of a same material as a material of the projecting sections of the base layers.

5. The semiconductor device according to claim 2, wherein the electrodes are interconnect electrodes substantially arc- or polygon-shaped in a plan view or having a shape bent at substantially an obtuse angle in a plan view and the base layers extend under the electrodes along an interconnection direction of the electrodes.

6. The semiconductor device according to claim 1, wherein the lateral end sections of the base layers projecting in the direction of the interlayer interface between the insulating films are chamfered to form slopes.

7. The semiconductor device according to claim 6, wherein a length of the lateral end sections of the base layers projecting from the lateral end sections of the electrodes in the direction of the interlayer interface between the insulating films is set to about 30 nm or more.

8. The semiconductor device according to claim 6, wherein the electrodes have side and upper surfaces covered by covering layers made of a same material as a material of the projecting sections of the base layers.

9. The semiconductor device according to claim 6, wherein the electrodes are interconnect electrodes substantially arc- or polygon-shaped in a plan view or having a shape bent at substantially an obtuse angle in a plan view and the base layers extend under the electrodes along an interconnection direction of the electrodes.

10. The semiconductor device according to claim 1, wherein the electrodes have side and upper surfaces covered by covering layers made of a same material as a material of the projecting sections of the base layers.

11. The semiconductor device according to claim 10, wherein the electrodes are interconnect electrodes substantially arc- or polygon-shaped in a plan view or having a shape bent at substantially an obtuse angle in a plan view and the base layers extend under the electrodes along an interconnection direction of the electrodes.

12. The semiconductor device according to claim 1, wherein the electrodes are interconnect electrodes substantially arc- or polygon-shaped in a plan view or having a shape bent at substantially an obtuse angle in a plan view and the base layers extend under the electrodes along an interconnection direction of the electrodes.

13. The semiconductor device according to claim 1, wherein the electrodes have side and upper surfaces covered by covering layers made of a same material as a material of the projecting sections of the base layers.

14. The semiconductor device according to claim 1, wherein the electrodes are interconnect electrodes substantially arc- or polygon-shaped in a plan view or having a shape bent at substantially an obtuse angle in a plan view and the base layers extend under the electrodes along an interconnection direction of the electrodes.

* * * * *